(12) United States Patent
Nojima et al.

(10) Patent No.: US 6,229,154 B1
(45) Date of Patent: May 8, 2001

(54) PHOTO DETECTING ELEMENT

(75) Inventors: Hideo Nojima, Nara; Kenji Nakanishi, Chiba, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/276,303

(22) Filed: Mar. 25, 1999

(30) Foreign Application Priority Data

Mar. 30, 1998 (JP) .................................................. 10-083082
Mar. 1, 1999 (JP) .................................................. 11-052078

(51) Int. Cl.[7] ........................... H01L 29/06; H01L 39/00; H01L 39/22; H01B 12/00; H01J 40/00
(52) U.S. Cl. ................................ 257/34; 257/30; 505/181
(58) Field of Search ....................... 257/30–34; 505/162, 505/180–182

(56) References Cited

U.S. PATENT DOCUMENTS 4,843,446 * 6/1989 Nishino et al. ......................... 257/32
5,155,093 * 10/1992 Den et al. ................................. 505/1
5,321,276 * 6/1994 Kurakado et al. ...................... 257/32

OTHER PUBLICATIONS

A. C. Rose–Innes et al., Introduction to Superconductivity, pp. 129–130, 1978.*

Electro–optic sampling of 1.5–ps photoresponse signal from $YBa_2Cu_3O_{7-\delta}$ thin films, Hegmann, et al, Appl. Phys. Lett., vol. 67(2), Jul. 10, 1995, pp. 285–287.

Magnetoresistance effect of $La_{0.72}Ca_{0.25}MnO_z/YBa_2Cu_3O_y/La_{0.72}Ca_{0.25}MnO_z$ trilayered films, Chahara, et al., Appl. Phys. Lett., vol. 62(7), Feb. 15, 1993, pp. 780–782.

Critical Current Suppression in a Superconductor by Injection of Spin–Polarized Carriers from a Ferromagnet, Vas'ko, et al., Phys. Rev. Lett., vol. 78, Feb. 10, 1997, pp. 1134–1137.

Fabrication of $YBa_2Cu_3O_{7-\delta}/SrTiO_3/La_{0.7}Sr_{0.3}MnO_{3-\delta}$ junctions for the control of supercurrent by spin–polarized quasiparticle current injection, Stroud, et al., J. Appl. Phys., vol., 83, Jun. 1, 1998, pp. 7189–7191.

Spin–polarized quasiparticle injection devices using $Au/YBa_2Cu_3O_7/LaAlO_3/Nd_{0.7}Sr_{0.3}$ $MnO_3$ heterostructures, Dong, et al., Appl. Phys. Lett., vol. 71(12), Sep. 22, 1997, pp. 1718–1720.

* cited by examiner

Primary Examiner—Eddie C. Lee
Assistant Examiner—Allan R. Wilson
(74) Attorney, Agent, or Firm—Dike, Bronstein, Roberts & Cushman, LLP; David G. Conlin; David A. Tucker

(57) ABSTRACT

An ultra high speed and high sensitivity photo detecting element is fabricated by laminating thin film layers of superconducting material and ferromagnetic material on a substrate. A photo detecting element composed of a photo detecting portion formed on a substrate by laminating alternately at least a thin film layer of ferromagnetic material and at least a thin film layer of high temperature superconducting material between which a thin film layer of insulating material is sandwiched and electrodes connected to the photo detecting portion.

6 Claims, 3 Drawing Sheets

PHOTO DETECTING ELEMENT

BACKGROUND OF THE INVENTION

The present invention relates to a photo detecting element and more particularly to a super high speed and high sensitive photo detecting element fabricated by multilayer of thin film high temperature superconducting material and thin film ferromagnetic material.

Recently, there have been actively conducted many research and development works for creating a network system that can effectively process a huge amount information at high speed by combining the fiber optics communications with ultra high speed switches. A superconducting switching element using single flux quantum (SFQ) has been developed as an ultra high speed switching element. This type switching element has a processing speed of about 100 Gb/s. Many attempts of coupling fiber optics communications with SFQ type ultra high speed switching elements usually have been made by using optical fibers and semiconductor photo detecting elements (photo diodes).

However, the semiconductor type photo detecting elements have not sufficient speed in response to radiation and further involves a problem that they can not be formed on the same substrates on which the SFQ switching elements made of superconducting material are formed. In other words, the separate arrangement of the photo detecting element from the SFQ switching element elongates the transmission path of data between them, which is associated with decrease of the SN ratio and the operation speed of the system. On the other hand, the high temperature superconductor has received a great deal of attention since it has a very excellent response to radiation and very suited to application as a superconducting photo detecting element (as described by Hegmann et. al., Appl. Phys. Lett., Vol. 67, 1995, pp. 285).

The examination has been made to develop new material by multilayer of high temperature superconducting material and perovskite type manganese oxides since both materials are similar to each other in crystal structure and have close lattice constants (Chahara et al., Appl. Phys. Lett. Vol. 62, 1993, pp. 780).

Recently, it has been reported that a three terminal device having a large amplification can be created by sandwiching a film of perovskite type insulating material between a film of superconducting material and a layer of perovskite type manganese oxide being ferromagnetic material having a large spin polarization f actor and by forcing spin polarized guasiparticles to inject from the ferromagnetic material into the superconducting material (Vas'koetal., Phys. Rev. Lett., Vol. 78, 1997, pp. 1134).

In view of the above, the present invention was directed to development of a photo detecting element made of superconducting material. Many attempts have also been made to develop, in particular, oxide high temperature superconducting material which was expected to realize a very short response time to radiation, which was estimated at 100 Gb/s or higher. However, the high temperature superconductor had a problem that it has small voltage sensitivity to radiation.

SUMMARY OF THE INVENTION

The primary object of the present invention is to provide an ultra high speed and high sensitive photo detecting element formed by multilayer of high temperature superconducting material and ferromagnetic material.

Another object of the present invention is to provide a photo detecting element which is fabricated by laminating thin films of superconducting material, ferromagnetic material and insulating material on a substrate by using an advanced laminating method and which can suppress the effect of injection of spin polarized carriers into the superconducting layer from the ferromagnetic layer through the insulating layer and can use only the effect of magnetic flux.

PREFERRED EMBODIMENT OF THE INVENTION

Figure 1A:
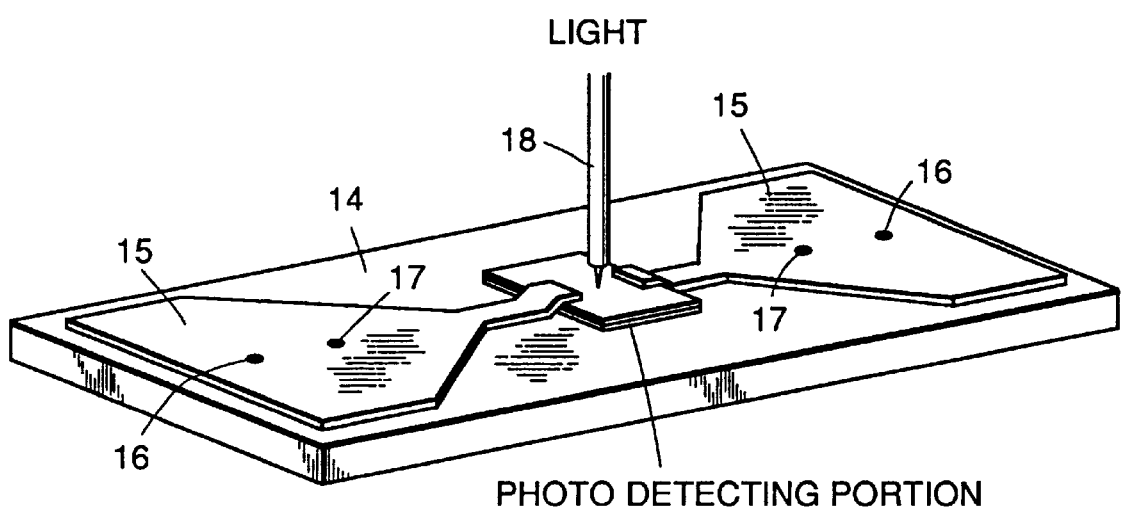
FIG. 1A shows a construction of a photo detecting element which is a first embodiment of the present invention.

We, inventors of the present application, have studied and examined the interaction between the superconducting layer and the ferromagnetic layer and have found the fact that the arrangement of the ferromagnetic substance close to the superconductor causes the magnetic field of the latter to effect the former in which a time required for recombining cooper pairs after separating of those pairs can be elongated and, in consequence of this, the sensitivity of the superconductor to light can be increased. The photo detecting element according to the present invention has been realized first on the basis of our finding described above.

Let us now examine the response of the photo detecting element to incident light. The response time (speed) of the photo detecting element can be expressed by a reciprocal number, $1/\tau$, of the time $\tau$ during which separated quasiparticles produced by the radiation are recombined again to form cooper pairs.

In the other words, the response time depends upon the time ($\tau$) during which cooper pairs in the superconductive state are separated to produce quasiparticles by the effect of incident light and the quasiparticles are recombined to form a cooper pair. The response time ($1/\tau$) is proportional to a cubic number of a critical temperature of the superconductor (Tc). This means that the superconductor can have a high speed response to light if it is a high temperature superconductor.

However, the time from separating a cooper pair to recombining quasiparticles is extremely short and its signal is difficult to detect.

Let examine the voltage sensitivity of the superconductor. When cooper pairs are exposed to light and decoupled to quasiparticles, an energy gap (2A) of the superconductor in proportion to the quasiparticles density (n) decreases according to the following formula (1).

$$\delta(2\Delta) = -n/N \tag{1}$$

where N is a density of state of the superconductor at the Fermi level.

As the energy gap decreases, the critical current density (Jc) decreases. Consequently, a voltage is generated at an applied constant current. Namely, the greater density (n) of quasiparticles increases the magnitude of the voltage generated.

Next, let us examine the quasiparticles density (n). Denoting the light intensity by (I), the superconductor film thickness by (t) and quasiparticle life time by (T), the density (n) of quasiparticles is expressed as follows:

$$n = I\tau/t \qquad (2)$$

The formula shows the longer quasiparticle life time ($\tau$) increases the quasiparticles density (n). Consequently, the energy gap decreases and the greater voltage is produced.

We, the inventors, found the fact that the voltage can be increased by applying a magnetic field to the superconductor, whereby the quasiparticles therein are reversely spun by the effect of the magnetic field and can therefore persist longer. To realize the above condition, it is essential that the ferromagnetic film disposed so close to the superconductor film that the magnetism of the former may cause the quasiparticles to persist longer to obtain an increased voltage.

On the other hand, there is a risk of deterioration of the superconducting state by the proximity effect if electric charge move between the ferromagnetic film and the superconducting film (i.e., both films are conductive to each other). It is also essentially important that an insulating film is sandwiched between the ferromagnetic film and the superconductive film.

To achieve the above mentioned purpose, the present invention is to provide a photo detecting element that comprises a photo detecting portion formed on a substrate by alternately laminating layers of at least a ferromagnetic thin film and at least a superconducting thin film with insertion of an insulating thin film between both layers, and electrodes connected with the photo detecting portion on the substrate.

This photo detecting element has an improved voltage sensitivity for the reason described above. In this instance, an instinctive response characteristic of the superconductor is somewhat decreased but sufficiently high. Such a decrease has no problem.

Another photo detecting element according to the present invention is featured in that the ferromagnetic thin film and the high temperature superconducting thin film are disposed so close to each other that the effect of magnetism of the ferromagnetic material can elongate a relaxation time during which quasi-particles are generated from cooper pairs by the effect of incident light and are then recombined to form cooper pairs in the high temperature superconducting thin film.

Another photo detecting element according to the present invention is featured by the ferromagnetic thin film having a thickness capable of being transparent to incident light.

Another photo detecting element is characterized in that the superconducting thin film formed on the insulating thin film possesses a meandering structure.

Since many high temperature superconductors are oxides at the present, the ferromagnetic material is preferred to be oxide ferromagnetic thin film in view of consistency in their lattice structures and interstitial diffusion of oxygen. For the same reason, the insulating layer interposed between the ferromagnetic layer and the superconducting layer is preferred to be an oxide insulating film. Accordingly, another photo detecting element is featured in that the superconducting thin film is of oxide high temperature superconducting material, the ferromagnetic thin film is of oxide ferromagnetic material and the insulating thin film is of oxide insulating material. This photo detecting element has, therefore, a laminate in which the oxide superconducting thin film and the oxide ferromagnetic thin film preferably match each other in lattice structure. Furthermore, the presence of the insulating thin film can prevent leakage of electrons due to the proximity effect between the oxide ferromagnetic thin film and the superconducting thin film. This can effectively prevent the deterioration of the superconductor. The photo detecting element thus achieves a high response speed and a high voltage sensitivity of the light detection.

Another photo detecting element according to the present invention is further preferable by that the oxide high temperature superconducting thin film is of material $YBa_2Cu_3O_{7-x}$, the oxide ferromagnetic thin film is of compound perovskite type manganese oxide expressed by (R, A)$MnO_3$ (R=La, Nd, Sm:A=Ca, Sr, Ba, Pb) and the insulating thin film is a thin film of material $SrTiO_3$. This photo detecting element has well matched lattice structures of the laminated photo detecting portion capable of high speed responding to radiation at an increased sensitivity of its detection voltage.

The method for manufacturing the photo detecting elements according to the present invention is featured by including a process of fabricating a photo detecting portion on a substrate alternately laminating thereon a ferromagnetic thin film and a superconducting film with insertion of an insulating film between there and a process of forming electrodes by one at both ends of the photo detecting portion on the substrate. This manufacturing method is effective to form a correct laminate of correctly matched and insulated layers of oxide ferromagnetic thin film and oxide superconducting thin film on a substrate.

It is also possible to use optical fibers to bring incident light to the laminate of insulated layers of oxide ferromagnetic thin film and oxide superconducting thin film. The combination of the photo detecting elements and optical fibers makes it possible to create a fiber optics communication system whereby a huge amount of information can be detected, processed and transmitted at increased speeds.

Figure 1B:
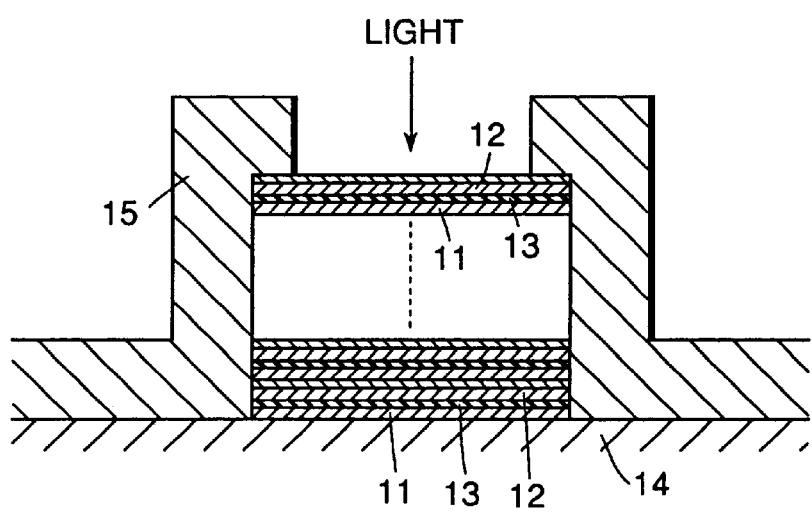
FIG. 1B is an enlarged sectional view of a photo detecting portion of the photo detecting element.

Referring to the accompanying drawings, preferred embodiments of the present invention will be described in detail as follows:

FIG. 1A shows a construction of a photo detecting element according to a first embodiment of the present invention and FIG. 1B is an enlarged sectional view of a photo detecting portion of the photo detecting element. As shown in FIG. 1B, the photo detecting portion is formed on a substrate 14 made of $SrTiO_3$ by successively laminating thereon layers of an oxide superconducting thin film 11 of $YBa_2Cu_3O_{7-x}$, an oxide insulating thin film 13 of $SrTiO_3$ and an oxide ferromagnetic thin film of $La_{0.9}Sr_{0.1}MnO_3$ in the described order. The ferromagnetic thin film 12 of $La_{1-x}Sr_xMnO_3$ behaves as an insulator when X<0.175 and becomes a ferromagnetic insulator having resistivity of $10^5$ ohms-cm at 77K when x=0.1.

In the construction of the photo detecting element according to the shown embodiment, the electrodes shall be formed from the end faces of the laminate. Therefore, it is absolutely important not to give a charge to the ferromagnetic thin films through their end faces from the electrodes.

A first possible method is to use the property of the ferromagnetic thin film. Namely, a ferromagnetic film that can serve as an insulator (does not behave as a metal) is prepared by changing its composition ratio. This method is preferably applied.

A second method is to provide the faces of each ferromagnetic layer with insulation against the electrodes by using micro processing technique. This is also effective to protect the ferromagnetic films against charges from the electrodes.

A method for manufacturing the photo detecting element according to the first embodiment of the present invention will be described below.

The thin film of $YBa_2Cu_3O_{7-x}$, the thin film of $La_{0.9}Sr_{0.1}MnO_3$ and the thin film of $SrTiO_3$ were laminated on the substrate $SrTiO_3$ (001) single crystal by a laser deposition method. Namely, sintered compacts $YBa_2Cu_3O_{7-x}$, $La_{0.9}Sr_{0.1}MnO_3$ and $SrTiO_3$ obtained by solid state reaction were used as targets which were then bombarded subsequently by laser beams from an excimer laser (KrF, 248 nm). As the results, respective materials were deposited in thin film layers to form a laminate on the substrate $SrTiO_3$. The intensity of the laser was 2 J/cm$^2$ and the temperature of the substrate was 800° C. Oxygen was induced under a partial pressure of 400 mTorr while the depositing the thin films.

First, we prepared separate thin film of $YBa_2Cu_3O_{7-x}$, the thin film of $La_{0.9}Sr_{0.1}MnO_3$, and the thin film of $SrTiO_3$ on separate substrates and examined the properties of the respective materials. The structures of the prepared thin films were analyzed by fluorescent X-ray spectroscopy (XRF), Rutherford backward scattering (RBS) and inductive coupling plasma spectroscopy (ICP). The results showed Y:Ba:Cu=1:2:3, La:Sr:Mn=0.9:0.1:1, Sr:Ti=1:1. The thin films having the same compositions with the target compacts were obtained. The results of X-ray diffraction analysis also proved that these thin films conformed with high quality films that we had grown epitaxially on substrates $SrTiO_3$.

Under the above described manufacturing condition, respective targets of materials were subsequently bombarded by laser beams so that the respective materials were deposited in thin film layers to form a laminate on a substrate. The laminate was composed of an oxide superconducting thin film $YBa_2Cu_3O_{7-x}$ and an oxide ferromagnetic thin film $La_{0.9}Sr_{0.1}MnO_3$ with interlayer of an oxide insulating thin film. The laser deposition was conducted until the desired number of insulated layers of the thin films. The superconducting layer had thickness of about 20 nm, the ferromagnetic layer had thickness of about 10 nm and the insulating layer had thickness of about 5 nm. The laminate consisted of 10 units of layers (1 unit includes a superconducting layer and a ferromagnetic layer) and therefore had a total thickness of 400 nm including insulating layers. After deposition of the thin films, the substrate with the laminate formed thereon were cooled to the room temperature in the oxygen atmosphere under the pressure of 500 Torr.

The prepared laminate was covered with photoresist leaving uncovered only portions for shaping the photo detecting portion. The uncovered portions were then removed by using argon ion beams. The shaped laminate was covered with photoresist (AZ-1518) and the portions for forming thereon electrodes were exposed and then thin films of silver Ag were deposited the exposed portions. The electrodes were formed by removing unnecessary thin film of Ag by the liftoff method.

The electrodes 15 were formed by thin films of Ag in the shape shown in FIG. 1A by the above process. Further, current terminals 16 and voltage terminals 17 were formed by ones on the electrodes 15 by the ultrasonic wire bonding method. The light receiving surface of the photo detecting portion was of 10 μm×10 μm square.

Figure 2:
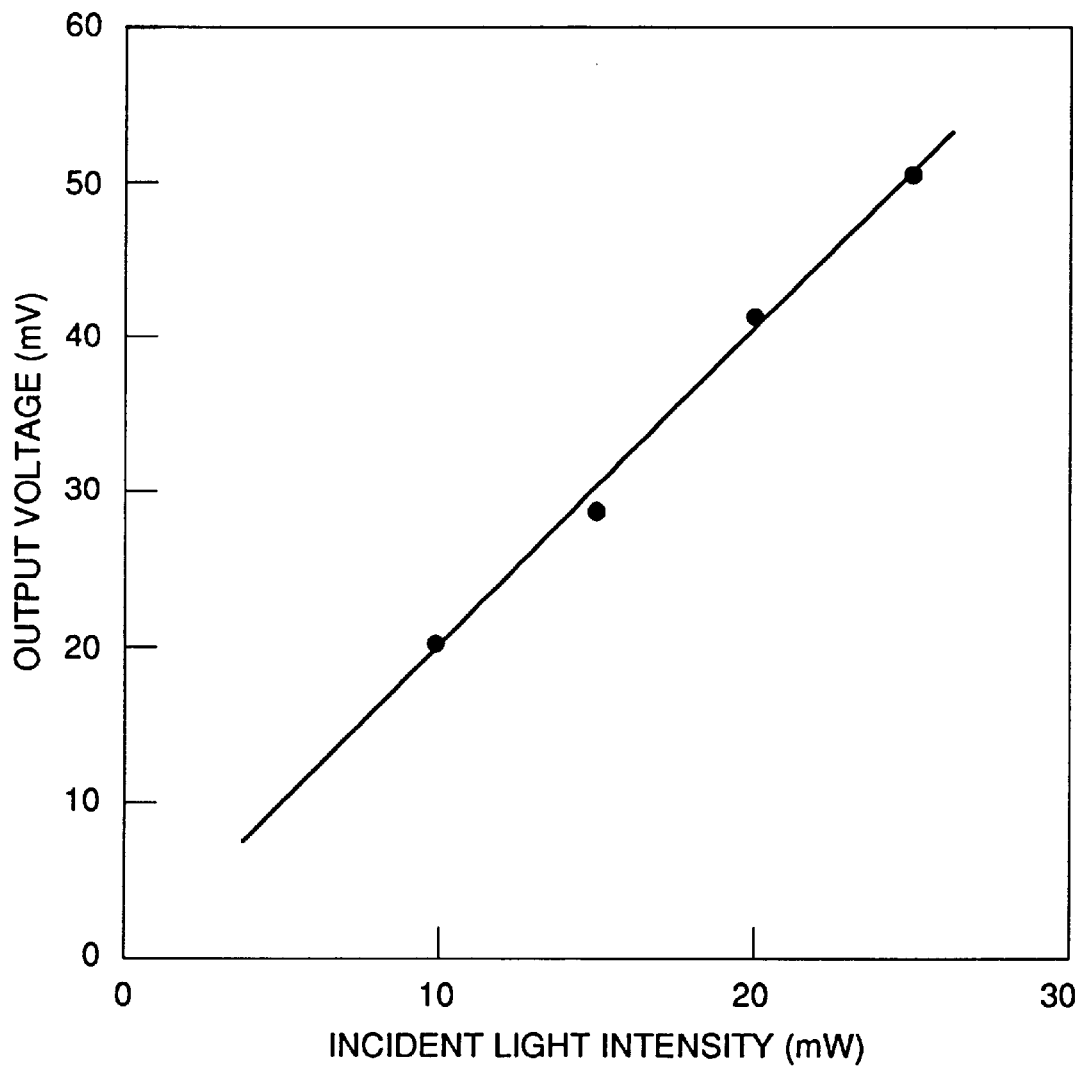
FIG. 2 is a graph showing a voltage sensitivity characteristic curve of the photo detecting element which is a first embodiment of the present invention.

The voltage sensitivity of the thus produced photo detecting element was examined at the liquid nitrogen temperature 77K. The photo detecting element in the state a constant current 10 mA applied to the terminals 16 was illuminated with light transmitted from a laser diode (of wave length of 800 nm) through an optical fiber 18. Voltages across the voltage terminals 17 were measured at different intensities of the light. A characteristic curve obtained from the measurement results is shown on the graph of FIG. 2, where incident light intensity is taken as abscissa and output voltage across the terminals 17 is taken as ordinate. As seen from FIG. 2, the photo detecting element according to the first embodiment of the present invention has a high voltage sensitivity of 20V/W.

The response time of the photo detecting element according to the first embodiment of the present invention was examined. The response time (speed) was measured at the liquid nitrogen temperature 77K. A Titanium (Ti)-sapphire laser (wavelength of 800 nm) was used as the light source. The photo detecting element was illuminated with light transmitted through an optical fiber 18 from the laser light source. The high speed response time of the element was measured by the pulse sampling method using Josephson junction of Nb/AlO$_x$/Nb (Ultra high speed Josephson device, published by Batfukan, p. 282). Namely, measurable signals are sampled by using extremely short wide pulses produced by a Josephson gate and superposed on a direct current applied by the direct current. A time resolution of 8.5 psec was obtained as the result of the measurement. This indicates that this embodiment could realize response time 117 GHz.

A photo detecting element for comparison was prepared in the same manner as described for the first embodiment of the present, excepting that the photo detecting portion consists of a single layer of oxide superconducting material $YBa_2Cu_3O_{7-x}$. This photo detecting element was examined in the same ways as described for the first embodiment. The voltage sensitivity of the element was 3V/W. Consequently, the photo detecting element according to the present invention proved to have greatly improved voltage sensitivity.

Figure 3:
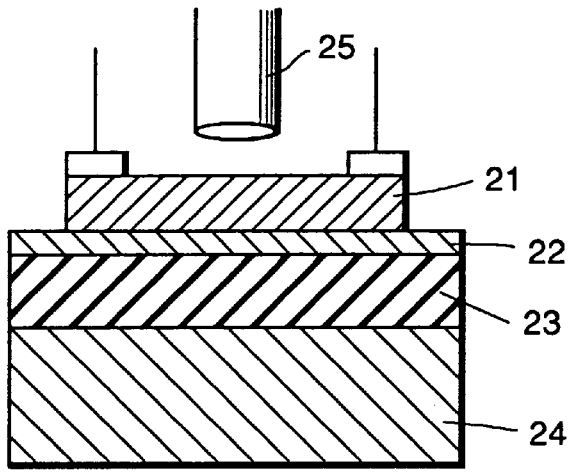
FIG. 3 is a sectional construction view of a photo detecting element according to the present invention.

FIG. 3 is a sectional construction view of a photo detecting element according to the second embodiment of the present invention. As shown in FIG. 3, a photo detecting element has a photo detecting portion composed of a superconducting thin film 21 of $NdBa_2Cu_3O_{7-x}$, a ferromagnetic thin film 22 of $La_{0.67}Ca_{0.33}MnO_3$ and an insulating thin film 23 of $LaAlO_3$, which portion formed on a substrate 24 of $LaAlO_3$.

The manufacturing method was the laser deposition method applied for the first embodiment. Namely, sintered compacts $NdBa_2Cu_3O_{7-x}$ (NBCO), $La_{0.67}Ca_{0.33}MnO_3$ (LCMO) and $LaAlO_3$ (LAO) obtained by solid state reaction then were bombarded in the order LCMO, LAO and NBCO by laser beams. The respective materials were deposited in thin film layers to form a laminate onto the substrate of $LaAlO_3$ (001) single crystal. The thin films LCMO, LAO and NBCO were 100 nm, 5 nm and 50 nm thick respectively. The intensity of the laser was 2 J/cm$^2$ and the temperature of the substrate was 800° C. The Ag electrodes were formed on the top layer (NBCO) by the same method as applied for the first embodiment and voltage and current terminals were then formed on the electrodes. The voltage sensitivity of the photo detecting element to radiation by a semiconductor laser (1.3 μm) was measured of 17V/W. The response time measured with radiation by the titanium sapphire laser was 10 ps.

Figure 4A:
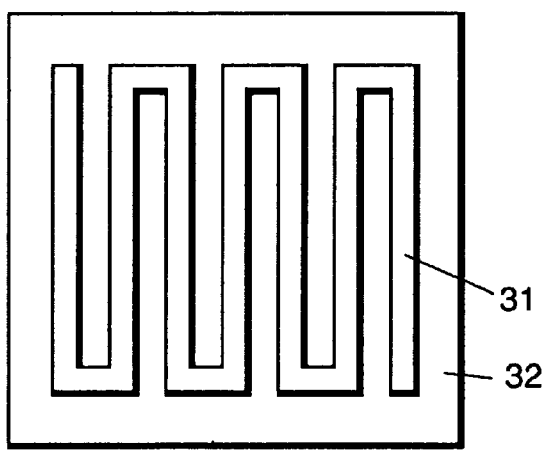
FIG. 4A shows a plan view of a photo detecting element respectively, which is a third embodiment of the present invention.
Figure 4B:
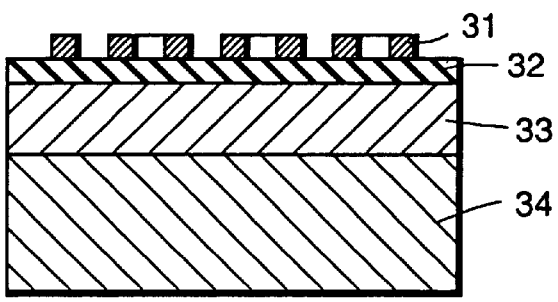
FIG. 4B shows a sectional view of a photo detecting element respectively, which is a third embodiment of the present invention.

Referring now to FIGS. 4A and 4B, a photo detecting element which is a third embodiment of the present invention will be described below. This photo detecting element is almost the same with the second embodiment excepting that the superconducting thin film having meander structure is used in the photo detecting portion. FIGS. 4A and 4B show the photo detecting element from the top and in cross section respectively. As shown in FIGS. 4A and 4B, the photo detecting portion composed of a superconducting thin film 31 of $NdBa_2Cu_3O_{7-x}$, a ferromagnetic thin film 33 of $Nd_{0.67}Ca_{0.33}MnO_3$ and an insulating thin film 32 of $SrTiO_3$, which portion formed on a single crystal substrate 34 of LSAT:$LaAlO_3$—$Sr_2AlTaO_6$ (001). The manufacturing method was the laser deposition method applied for the first embodiment. Namely, sintered compacts $NdBa_2Cu_3O_{7-x}$ (NBCO), $La_{0.67}Ca_{0.33}MnO_3$ (LCMO) and $LaAlO_3$ (LAO) obtained by solid state reaction then were bombarded in the order LCMO, LAO and NBCO by laser beams. The respective materials were deposited in thin film layers to form a laminate onto the substrate.

The superconducting layer was then shaped to meandering form by using the photolithographical method. The thin films LCMO, LAO and NBCO were 100 nm, 5 nm and 50 nm thick respectively. The meandering line was 1 $\mu$m in width. The intensity of the laser was 2 $J/cm^2$ and the temperature of the substrate was 800° C. The Ag electrodes were formed on the top layer (NBCO) by the same method as applied for the second embodiment and voltage and current terminals were then formed on the electrodes. The voltage sensitivity of the photo detecting element to radiation by a semiconductor laser (1.5 $\mu$m) was 25V/W. The response time measured with radiation by the titanium sapphire laser was 12 ps.

Although the invention has been described in its preferredforms, it is understood that all the embodiments are illustrative and not restrictive and that various changes and modifications may be made particularly in shape, material and method of manufacturing the elements. The superconducting material, ferromagnetic material, insulating material and substrate material that compose the essential portion of the present invention may be selected among possible materials satisfying the following requirements.

Namely, superconducting material is not limited to $YBa_2Cu_3O_{7-x}$ and may be selected within the high temperature superconductors, e.g., 123 series such as $NdBa_2Cu_3O_{7-x}$, Cu-series such as $CuBa_2Ca_3Cu_4O_y$, Bi-series such as $Bi_2Sr_2Ca_2Cu_3O_y$, Tl-series such as $Tl_2Ba_2Ca_2Cu_3Oy$ and Hg-series such as $HgBa_2Ca_2Cu_3Oy$. Material having a high critical temperature (tc) is useful since the time required for recombining quasiparticles at a gap end is in inverse proportion to a cubic number of Tc. For example, superconducting material of Ln-123-series (Ln=Y, Nd, Sm) with tc=90K class can be used effectively. Superconductors of Cu-series with Tc=117K class and Bi-series are also useful. Above mentioned Tl-series and Hg-series materials are highly volatile and difficult to form an even thin film but may be applied to manufacture the element according to the present invention.

Ferromagnetic material is not limited to $Nd_{1-x}Sr_xMnO_3$, $La_{1-x}Sr_xMnO_3$ and $La_{1-x}Ca_xMnO_3$ and may be selected within the ferromagnetic substances, e.g., $(R,A)MnO_3$(R= La, Nd, Sm:A=Ca, Sr, Ba, Pb), $Sr_2MoFeO_6$, $Ba_2MoFeO_6$ and $Ca_2MoFeO_6$.

In view of that all films are epitaxially formed, perovskite type manganese oxides can be preferably used. These materials possess relatively large saturation magnetization and are favorable ferromagnetic property. They are best suited in lattice structure to superconductors. Ferrite materials that are somewhat inferior in epitaxial growth to the above but can be applied as useful material for the photo detecting elements according to the present invention. Magnetic metal can be used for form a top layer of a laminate (photo detecting portion) since processing temperature is low. In this case, it is needed to illuminate the laminate from the bottom. Magnetic metal is usable on the above condition.

Insulating material is not limited to $SrTiO_3$ and may be selected among other insulating materials such as $LaAlO_3$ and MgO. The insulating thin film is required to possess such properties that can prevent leakage between the superconducting layer and the ferromagnetic layer, does not allow injection of carriers from the ferromagnetic layer into the superconducting layer, does not permit tunnel current, prevents the proximity effect and allows only magnetic flux of the ferromagnetic layer to penetrate therethrough into the superconducting layer. In view of that all films are epitaxially formed on the substrate, it is preferable to prepare the insulating layer of the same material with the substrate (e.g. $SrTiO_3$).

Substrate material is not limited to $LaAlO_3$ used in the embodiments. The substrate must be made of material suitable for epitaxially growing thin layers of superconductive material and ferromagnetic material thereon. Namely, it must be suited in its lattice constant and thermal expansion coefficient to the high temperature superconducting layer and ferromagnetic layer of perovskite type manganese oxide. The substrate having the perovskite structure and the lattice constant of about 3.86 A is preferably used. For example, the substrates made of $SrTiO_3$ (a=3.905) and LSAT ($LaAlO_3$—$Sr_2AlTaO_6$, a=3.86) are suited for use. It is also possible to use substrates made of $LaAlO_3$ (a=3.79) and MgO, which are somewhat inferior to the above.

Finally, all thin layers are desirable to be transparent to incident light.

As is apparent from the foregoing, the photo detecting element according to the present invention has a photo detecting portion composed of laminated layers of high temperature superconducting material, ferromagnetic material and insulating material disposed between the above two layers, which has an improved voltage sensitivity of the superconductor layer owing to elongation of a time interval during which cooper pairs in the high temperature superconducting thin film are separated by the effect of incident light and then recombinated. The photo detecting element can therefore detect light at ultrahigh speed and high sensitivity.

According to the present invention, it is possible to produce a high sensitivity ultrahigh speed photo detecting element having a photo detecting portion composed of laminated thin layers of oxide superconducting material, oxide ferromagnetic material and oxide insulating material interposed between the above two layers. It is also possible to combine the fiber optics communication and ultrahigh speed switch to create network switches capable of processing huge amount of information at high speed.

What is claimed is:

1. A photo detecting element comprising:
    a photo detecting portion formed on a substrate, said photo detecting portion defining a multilayered structure including one or more ferromagnetic thin film layers each having the same first thickness, one or more high temperature superconducting thin film layers each having the same second thickness and one or more insulating thin film layers each having the same third thickness, and
    electrodes connected to the photo detecting portion;
    wherein each of said one or more ferromagnetic thin film layers is transparent to incident light;

wherein said first thickness is substantially thinner than said second thickness and said third thickness is substantially thinner than said first thickness; and wherein said multilayered structure is so assembled that (i) said one or more ferromagnetic thin film layers and said one or more high temperature superconducting thin film layers are disposed in alternating relationship relative to each other, and (ii) an insulating thin film layer is interposed between each ferromagnetic thin film layer and each high temperature superconducting thin film layer such that said ferromagnetic and said high temperature superconducting thin film layers are disposed so close to each other that magnetism from said one or more ferromagnetic thin film layers can elongate a relaxation time during which quasi-particles are generated from cooper pairs by the effect of incident light and are then recombined to form cooper pairs in said one or more high temperature thin film layers.

2. A photo detecting element as defined in claim 1, wherein at least one of the high temperature superconducting thin film layers comprises a strip of high temperature superconducting thin film material arranged so as to define a pattern substantially, but not totally, filling a surface area corresponding to the respective surface areas of each of the thin film layers adjacent thereto in said multilayered structure.

3. A photo detecting element as defined in claim 1, wherein the superconducting thin film is of oxide high temperature superconducting material, the ferromagnetic thin film is of oxide ferromagnetic material and the insulating thin film is of oxide insulating material.

4. A photo detecting element as defined in claim 2, wherein the superconducting thin film is of oxide high temperature superconducting material, the ferromagnetic thin film is of oxide ferromagnetic material and the insulating thin film is of oxide insulating material.

5. A photo detecting element as defined in claim 3, wherein the oxide high temperature superconducting thin film is of material $YBa_2Cu_3O_{7-x}$, the oxide ferromagnetic thin film is of compound perovskite type manganese oxide expressed by (R, A) $MnO_3$ (R=La, Nd, Sm:A=Ca, Sr, Ba, Pb) and the insulating thin film is of material $SrTiO_3$.

6. A photo detecting element as defined in claim 4, wherein the oxide high temperature superconducting thin film is of material $YBa_2Cu_3O_{7-x}$, the oxide ferromagnetic thin film is of compound perovskite type manganese oxide expressed by (R, A) $MnO_3$ (R=La, Nd, Sm:A=Ca, Sr, Ba, Pb) and the insulating thin film is of material $SrTiO_3$.

* * * * *